(12) United States Patent
Hayashi

(10) Patent No.: US 8,211,232 B2
(45) Date of Patent: Jul. 3, 2012

(54) SUBSTRATE PROCESSING APPARATUS

(75) Inventor: Daisuke Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1155 days.

(21) Appl. No.: 12/019,911

(22) Filed: Jan. 25, 2008

(65) Prior Publication Data

US 2008/0178914 A1 Jul. 31, 2008

Related U.S. Application Data

(60) Provisional application No. 60/911,662, filed on Apr. 13, 2007.

(30) Foreign Application Priority Data

Jan. 26, 2007 (JP) ................................. 2007-017048

(51) Int. Cl.
   *C23C 16/00* (2006.01)
   *C23C 16/455* (2006.01)
   *C23C 16/46* (2006.01)

(52) U.S. Cl. .... 118/715; 118/724; 118/733; 156/345.33

(58) Field of Classification Search ................. 118/715, 118/724, 733; 156/345.33
   See application file for complete search history.

(56) References Cited

U.S. PATENT DOCUMENTS

| | | | | | |
|---|---|---|---|---|---|
| 5,950,925 A | * | 9/1999 | Fukunaga et al. | ......... | 239/132.3 |
| 5,968,593 A | * | 10/1999 | Sakamoto et al. | ......... | 427/248.1 |
| 6,051,072 A | * | 4/2000 | Harada | .......... | 118/715 |
| 6,056,823 A | * | 5/2000 | Sajoto et al. | ................. | 118/715 |
| 6,086,677 A | * | 7/2000 | Umotoy et al. | .............. | 118/715 |
| 6,165,271 A | * | 12/2000 | Zhao et al. | ..................... | 118/715 |
| 6,221,791 B1 | * | 4/2001 | Wang et al. | ................... | 438/773 |
| 6,258,170 B1 | * | 7/2001 | Somekh et al. | ............... | 118/715 |
| 6,296,709 B1 | * | 10/2001 | Krivokapic | .................. | 118/697 |
| 6,302,964 B1 | * | 10/2001 | Umotoy et al. | .............. | 118/715 |
| 6,364,954 B2 | * | 4/2002 | Umotoy et al. | .............. | 118/715 |
| 6,444,039 B1 | * | 9/2002 | Nguyen | ........................ | 118/715 |
| 6,527,865 B1 | * | 3/2003 | Sajoto et al. | ................. | 118/715 |
| 6,635,114 B2 | * | 10/2003 | Zhao et al. | .................... | 118/715 |
| 6,903,030 B2 | * | 6/2005 | Ishii et al. | ..................... | 438/782 |
| 7,572,337 B2 | * | 8/2009 | Rocha-Alvarez et al. | .... | 118/715 |
| 2002/0015855 A1 | * | 2/2002 | Sajoto et al. | ................. | 428/639 |
| 2002/0121242 A1 | * | 9/2002 | Minami et al. | ............... | 118/724 |
| 2002/0124800 A1 | * | 9/2002 | Moriyama | .................... | 118/715 |
| 2003/0033978 A1 | * | 2/2003 | Zhao et al. | ................... | 118/715 |
| 2003/0106495 A1 | * | 6/2003 | Asano et al. | ................... | 118/724 |
| 2003/0111013 A1 | * | 6/2003 | Oosterlaken et al. | ......... | 118/724 |

(Continued)

FOREIGN PATENT DOCUMENTS

JP 2005-39185 2/2005

*Primary Examiner* — Jeffrie R Lund

(74) *Attorney, Agent, or Firm* — Oblon, Spivak, McClelland, Maier & Neustadt, L.L.P.

(57) ABSTRACT

A substrate processing apparatus that can reduce the number of parts. A first gas introduction hole through which the hydrogen fluoride gas is introduced into a GDP is formed in an upper lid. A second gas introduction hole through which hydrogen fluoride gas is introduced from a hydrogen fluoride gas source is formed in a processing vessel. When the upper lid engages the upper portion of the processing vessel, one end of the first gas introduction hole is joined with one end of the second gas introduction hole to form an introduction path through which the hydrogen fluoride gas is introduced into a chamber.

9 Claims, 4 Drawing Sheets

U.S. PATENT DOCUMENTS

| | | | |
|---|---|---|---|
| 2003/0175426 A1* | 9/2003 | Shiratori | 427/255.37 |
| 2003/0221623 A1* | 12/2003 | Shima et al. | 118/724 |
| 2004/0118519 A1* | 6/2004 | Sen et al. | 156/345.33 |
| 2004/0168638 A1* | 9/2004 | Ishii et al. | 118/724 |
| 2004/0262254 A1 | 12/2004 | Ozawa et al. | |
| 2005/0225937 A1* | 10/2005 | Saito et al. | 361/688 |
| 2005/0263072 A1* | 12/2005 | Balasubramanian et al. | 118/715 |
| 2006/0021703 A1* | 2/2006 | Umotoy et al. | 156/345.34 |
| 2007/0157882 A1* | 7/2007 | Ozaki et al. | 118/715 |
| 2008/0178914 A1* | 7/2008 | Hayashi | 134/105 |
| 2009/0250005 A1* | 10/2009 | Kaneko et al. | 118/724 |
| 2010/0192855 A1* | 8/2010 | Yuasa et al. | 118/696 |

\* cited by examiner

SUBSTRATE PROCESSING APPARATUS

BACKGROUND OF THE INVENTION

1. Field of the Invention

The present invention relates to a substrate processing apparatus, and particularly to a substrate processing apparatus having an upper lid that engages a processing vessel to define a substrate processing chamber.

2. Description of the Related Art

In a semiconductor device manufacturing method for manufacturing a semiconductor device from a silicon wafer (hereinafter simply referred to as "wafer"), the following steps are repeatedly carried out in a sequential manner: a film formation step of forming a conductive film or an insulating film on the surface of the wafer using CVD (Chemical Vapor Deposition) or the like, a lithography step of forming a photoresist layer having a desired pattern on the formed conductive film or insulating film, and an etching step of using the photoresist layer as a mask to shape the conductive film into a gate electrode or form a wiring groove or a contact hole in the insulating film by using plasma generated from a process gas.

For example, in a certain semiconductor device manufacturing method, a polysilicon layer formed on a wafer is etched in some cases. In this case, a deposit film primarily made of $SiO_2$ is formed on the side surfaces of a trench (groove) formed in the wafer.

Since the deposit film may cause problems in the semiconductor device, such as conduction failure, the deposit film must be removed. As a method for removing the deposit film, there is known a substrate processing method for carrying out COR (Chemical Oxide Removal) and PHT (Post Heat Treatment) on the wafer. In COR, $SiO_2$ in the deposit film chemically reacts with gas molecules to form a product, and in PHT, the wafer that has undergone the COR is heated to vaporize and sublimate the product formed on the wafer in the COR chemical reaction. The product is thus removed from the wafer.

As a substrate processing apparatus that carries out the substrate processing method including the COR and PHT steps, there is known a substrate processing apparatus including a chemical reaction processing apparatus and a thermal processing apparatus connected to the chemical reaction processing apparatus (see, for example, Japanese Laid-Open Patent Publication No. 2005-39185 (corresponding to U.S. Laid-open Patent Publication No. 2004/0262254)).

The above chemical reaction processing apparatus typically includes a processing chamber (hereinafter referred to merely as "chamber") that accommodates a wafer, a shower head that serves as a gas supplying portion for supplying hydrogen fluoride gas or the like as a process gas into the chamber, and a mounting stage on which the wafer is mounted. The shower head is disposed in such a way that it faces the wafer mounted on the mounting stage. On the other hand, the chamber has an openable/closable upper lid. The shower head is incorporated in the upper lid of the chamber, and an introduction tube through which the hydrogen fluoride gas or the like is introduced into the shower head is connected to the upper lid of the chamber.

In the hydrogen fluoride gas, hydrogen fluoride molecules are clustered, that is, hydrogen fluoride molecules are linearly bonded. Dissociation of the hydrogen fluoride molecule clusters, which depends on the change in temperature and pressure, causes abrupt decrease in temperature, sometimes resulting in liquefaction of the hydrogen fluoride gas in an introduction path that communicates with the chamber of the chemical reaction processing apparatus. It is noted that hydrogen fluoride gas boils at 19.5° C. (near room temperature) at atmospheric pressure (760 Torr), and liquefies at room temperature at or near atmospheric pressure.

In a conventional chemical reaction processing apparatus using hydrogen fluoride gas described above, the temperatures of all members that form the introduction path through which the hydrogen fluoride gas is introduced into the chamber are controlled to prevent liquefaction of the hydrogen fluoride gas in the introduction path.

However, in and around the upper lid of the chamber, the introduction tube described above is routed in a complicated manner. To control the temperature of the entire introduction tube including a portion thereof in the vicinity of the upper lid, the number of the parts used for temperature control increases. Further, to open and close the upper lid of the chamber, it is necessary to configure the introduction tube connected to the upper lid of the chamber to be detachable, and designing a detachable introduction tube requires extra parts.

Therefore, when the introduction tube is connected to the upper lid of the chamber, the number of parts used to form the substrate processing apparatus increases.

SUMMARY OF THE INVENTION

The present invention provides a substrate processing apparatus capable of reducing the number of parts.

Accordingly, in a first aspect of the present invention, there is provided a substrate processing apparatus comprising a processing vessel adapted to accommodate a substrate and an upper lid adapted to engage the processing vessel so as to define a processing chamber for the substrate, wherein the upper lid includes a gas supplying portion adapted to supply a process gas into the processing chamber, a first gas introduction hole is formed in the upper lid, one end of the first gas introduction hole being connected to the gas supplying portion to introduce the process gas into the gas supplying portion, a second gas introduction hole is formed in the processing vessel, one end of the second gas introduction hole being connected to a source of the process gas to introduce the process gas from the source, and when the upper lid engages the processing vessel, the other end of the first gas introduction hole is joined with the other end of the second gas introduction hole.

According to the first aspect of the present invention, when the upper lid engages the processing vessel, the first gas introduction hole, which is formed in the upper lid to introduce the process gas into the gas supplying portion, is joined with the second gas introduction hole, which is formed in the processing vessel to introduce the process gas from the source of the process gas. An introduction path through which the process gas is introduced into the processing chamber is thus formed. As a result, the process gas can be introduced into the processing chamber without connecting an introduction tube, through which the process gas is introduced into the processing chamber, to the upper lid, so that the number of parts that form the substrate processing apparatus can be reduced.

The first aspect of the present invention can provide a substrate processing apparatus, further comprising a first temperature adjustment mechanism adapted to adjust the temperature of the upper lid and a second temperature adjustment mechanism adapted to adjust the temperature of the processing vessel.

According to the first aspect of the present invention, the temperature of the upper lid and the temperature of the processing vessel are adjusted, so that the temperature of the first gas introduction hole formed in the upper lid and the temperature of the second gas introduction hole formed in the processing vessel are adjusted. As a result, the temperature of the process gas flowing through the first and second gas introduction holes can be adjusted. It is therefore possible to prevent liquefaction of the process gas in the first and second gas introduction holes. That is, the need to provide a dedicated temperature adjustment mechanism for preventing liquefaction of the process gas can be eliminated.

Accordingly, in a second aspect of the present invention, there is provided a substrate processing apparatus comprising a processing vessel adapted to accommodate a substrate and an upper lid adapted to engage the processing vessel so as to define a processing chamber for the substrate, wherein the upper lid includes a gas supplying portion adapted to supply a process gas into the processing chamber, a gas introduction hole is formed in the upper lid, one end of the gas introduction hole being connected to the gas supplying portion to introduce the process gas into the gas supplying portion, a gas introduction tube is attached to the processing vessel, one end of the gas introduction tube being connected to a source of the process gas to introduce the process gas from the source, and when the upper lid engages the processing vessel, the other end of the gas introduction hole is joined with the other end of the gas introduction tube.

According to the second aspect of the present invention, when the upper lid engages the processing vessel, the gas introduction hole, which is formed in the upper lid to introduce the process gas into the gas supplying portion, is joined with the gas introduction tube, which is attached to the processing vessel to introduce the process gas from the source of the process gas. An introduction path through which the process gas is introduced into the processing chamber is thus formed. As a result, the process gas can be introduced into the processing chamber without connecting an introduction tube, through which the process gas is introduced into the processing chamber, to the upper lid, so that the number of parts that form the substrate processing apparatus can be reduced.

The second aspect of the present invention can provide a substrate processing apparatus, further comprising a first temperature adjustment mechanism adapted to adjust the temperature of the upper lid and a second temperature adjustment mechanism adapted to adjust the temperature of the processing vessel.

According to the second aspect of the present invention, the temperature of the upper lid and the temperature of the processing vessel are adjusted. When the temperature of the upper lid is adjusted, the temperature of the gas introduction hole formed in the upper lid is adjusted accordingly. On the other hand, when the temperature of the processing vessel is adjusted, the heat of the processing vessel is transmitted to the gas introduction tube attached to the processing vessel, so that the temperature of the gas introduction tube is adjusted. As a result, the temperature of the process gas flowing through the gas introduction hole and the gas introduction tube can be adjusted. It is therefore possible to prevent liquefaction of the process gas in the gas introduction hole and the gas introduction tube. That is, the need to provide a dedicated temperature adjustment mechanism for preventing liquefaction of the process gas can be eliminated.

The features and advantages of the invention will become more apparent from the following detailed description taken in conjunction with the accompanying with drawings.

BRIEF DESCRIPTION OF THE DRAWINGS

FIG. 3A shows the upper lid detached from a processing vessel, and FIG. 3B shows the upper lid engaged with the upper portion of the processing vessel.

DETAILED DESCRIPTION OF THE PREFERRED EMBODIMENTS

Embodiments of the present invention will be described below with reference to the drawings.

First, a description will be made of a substrate processing system including a substrate processing apparatus according to a first embodiment of the present invention.

Figure 1:
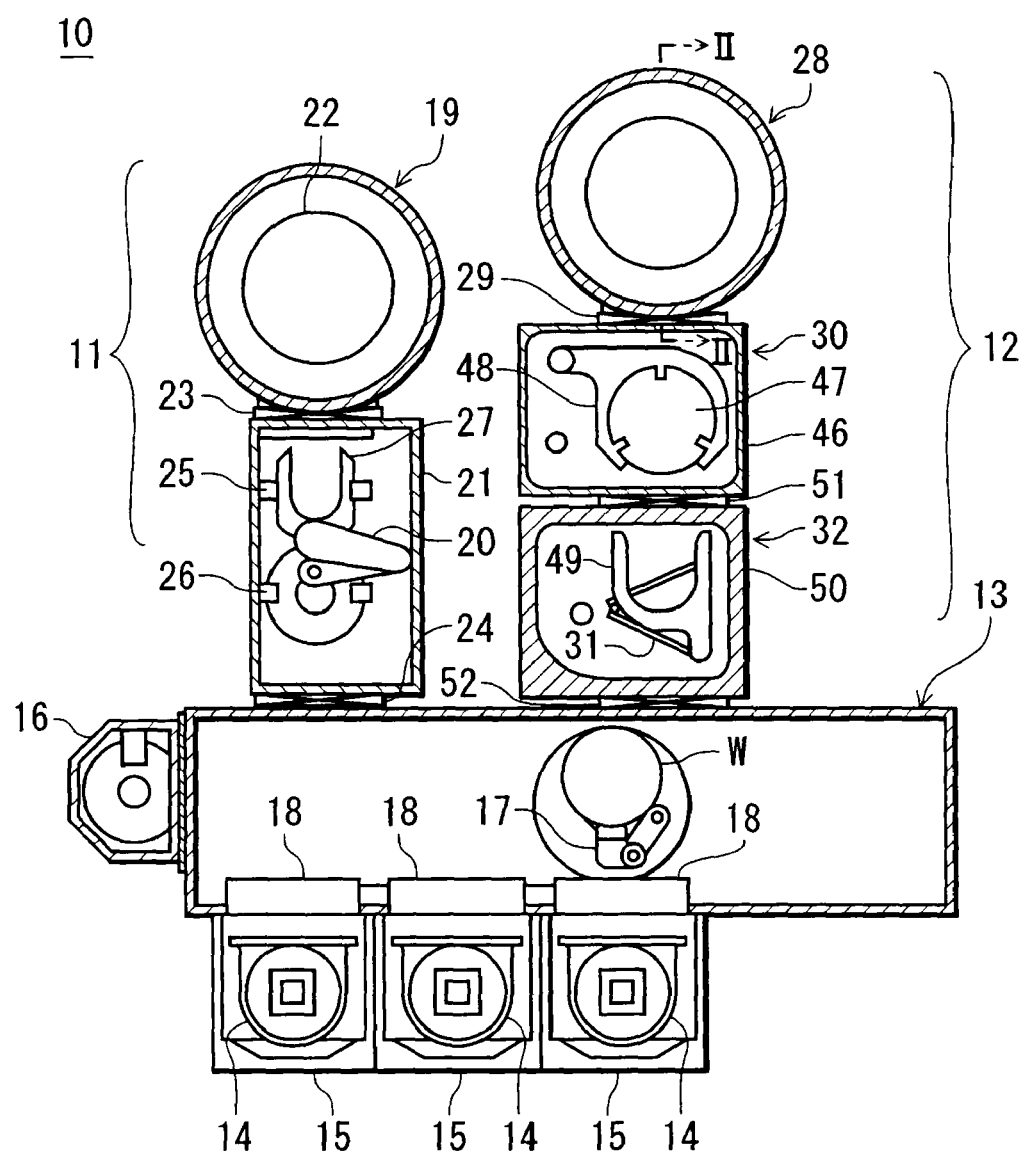
FIG. 1 is a plan view schematically showing the configuration of a substrate processing system including a substrate processing apparatus according to a first embodiment of the present invention.

FIG. 1 is a plan view schematically showing the configuration of the substrate processing system including the substrate processing apparatus according to present embodiment.

In FIG. 1, the substrate processing system 10 includes a first process ship 11 that carries out plasma processing on a wafer (substrate) for semiconductor devices (hereinafter simply referred to as "wafer") W, and a second process ship 12 disposed parallel to the first process ship 11 and configured to carry out chemical reaction processing and heating processing, which will be described later, on the wafer W. The substrate processing system 10 further includes a loader module 13, which serves as a box-shaped common transfer chamber to which the first and second process ships 11 and 12 are connected.

In addition to the first and second process ships 11 and 12, the loader module 13 is connected to three FOUP (Front Opening Unified Pod) mounting tables 15 on each of which is mounted a FOUP 14, which serves as a container that accommodates twenty-five wafers W, as well as an orienter 16 that prealigns the position of each wafer W transferred out of the FOUP 14.

The first and second process ships 11 and 12 are connected to a longitudinal sidewall of the loader module 13 and disposed on the opposite side of the loader module 13 to the three FOUP mounting tables 15. The orienter 16 is disposed at a longitudinal end of the loader module 13.

The loader module 13 has a built-in SCARA dual arm-type transfer arm mechanism 17 that transfers each wafer W. Three loading ports 18 through which wafers W are introduced are disposed along a sidewall of the loader module 13 in correspondence to the FOUP mounting tables 15. The transfer arm mechanism 17 picks up a wafer W from one of the FOUPs 14 mounted on the corresponding FOUP mounting table 15 through the loading port 18, and transfers the picked up wafer W to and from the first process ship 11, the second process ship 12, and the orienter 16.

The first process ship 11 has a first process module 19 that carries out plasma processing on the wafer W, and a first load-lock module 21 having a first built-in link-type, single pick-type transfer arm 20 that transfers the wafer W to and from the first process module 19.

The first process module 19 has a cylindrical processing chamber and upper and lower electrodes (not shown) disposed in the chamber. The distance between the upper and lower electrodes is appropriately set to carry out etching on the wafer W as the plasma processing. The lower electrode has, at the top thereof, an ESC (electrostatic chuck) 22 that chucks the wafer W using a Coulomb force or the like.

In the first process module 19, a process gas is introduced into the chamber, and an electric field is generated between the upper and lower electrodes to convert the introduced process gas into plasma so as to produce ions and radicals. The wafer W is then etched by the ions and radicals.

The internal pressure in the loader module 13 is held at atmospheric pressure, whereas the internal pressure in the first process module 19 is held at vacuum. To this end, the first load-lock module 21 has a vacuum gate valve 23 at the connecting portion between the first load-lock module 21 and the first process module 19 and an atmospheric gate valve 24 at the connecting portion between the first load-lock module 21 and the loader module 13, so that the first load-lock module 21 is configured as a preliminary vacuum transfer chamber capable of adjusting the internal pressure therein.

The following components are disposed in the first load-lock module 21: the first transfer arm 20 disposed substantially at the center of the first load-lock module 21, a first buffer 25 disposed on the side closer to the first process module 19 with respect to the first transfer arm 20, and a second buffer 26 disposed on the side closer the loader module 13 with respect to the first transfer arm 20. The first and second buffers 25 and 26 are disposed above the track along which a supporting portion (pick) 27 moves. The supporting portion 27 is disposed at the front end of the first transfer arm 20 and supports each wafer W. By temporarily displacing the etched wafer W above the track of the supporting portion 27, an unetched wafer W and the etched wafer W can be smoothly swapped in the first process module 19.

In the first process ship 11 of the substrate processing system 10, a hard mask having a predetermined pattern formed on the wafer W is used to etch a polysilicon layer of the wafer W. In this process, a deposit film comprised of an SiOBr layer, that is, a pseudo $SiO_2$ layer, is formed on the side surfaces of a trench (groove) formed by the etching. It is preferable to simultaneously remove the deposit film and the hard mask formed on the wafer W from the viewpoint of improving throughput.

In the second process ship 12 of the substrate processing system 10, chemical reaction processing using hydrogen fluoride gas as a process gas is carried out on the wafer W, and heating processing is further carried out thereon, so as to simultaneously remove the deposit film and the hard mask. The hard mask can by nature be removed by hydrogen fluoride. The deposit film can be removed using the following chemical reaction processing and heating processing:
(Chemical Reaction Processing)

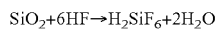

(Heating Processing)

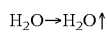

The second process ship 12 has a second process module 28 (substrate processing apparatus) that carries out the above chemical reaction processing on the wafer W, and a third process module 30 connected to the second process module 28 via a vacuum gate valve 29, the third process module 30 carrying out the above heating processing on the wafer W. The second process ship 12 also has a second load-lock module 32 having a second built-in link-type, single pick-type transfer arm 31 that transfers the wafer W to and from the second and third process modules 28 and 30.

Figure 2:
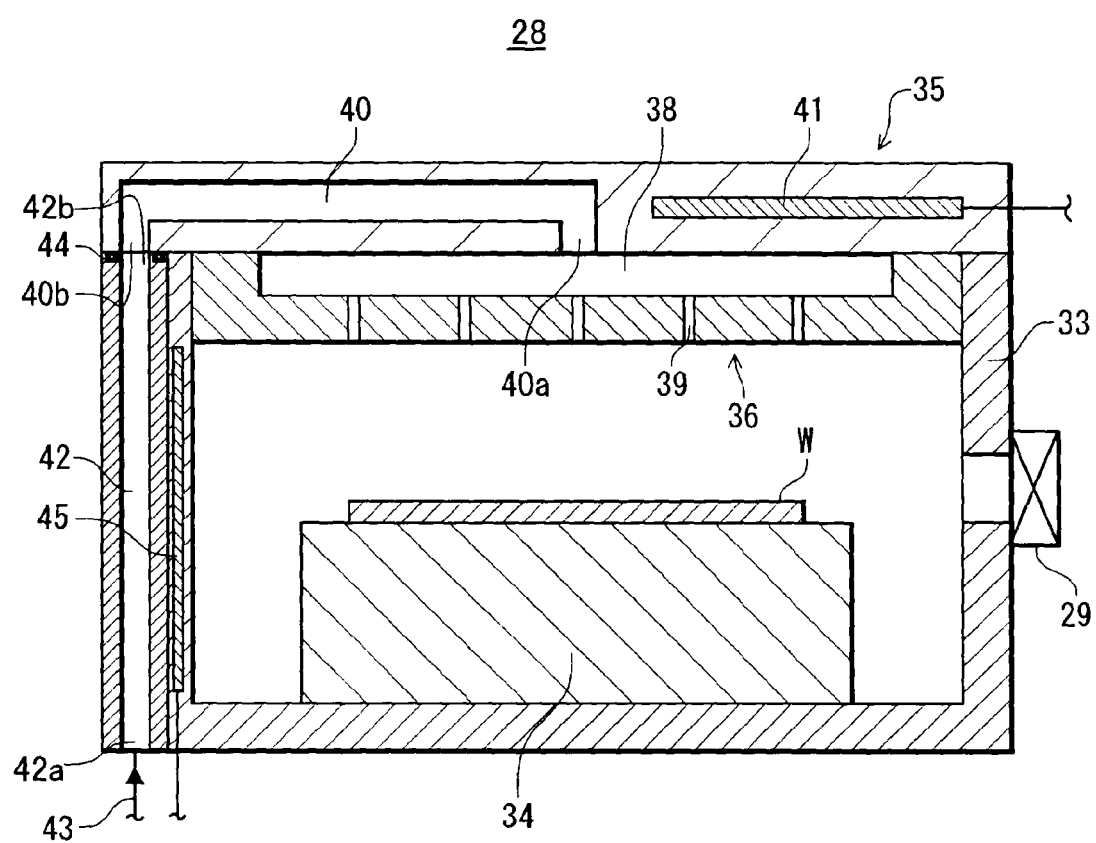
FIG. 2 is a cross-sectional view taken along the line II-II in FIG. 1.

FIG. 2 is a cross-sectional view taken along the line II-II in FIG. 1.

Figure 3A:
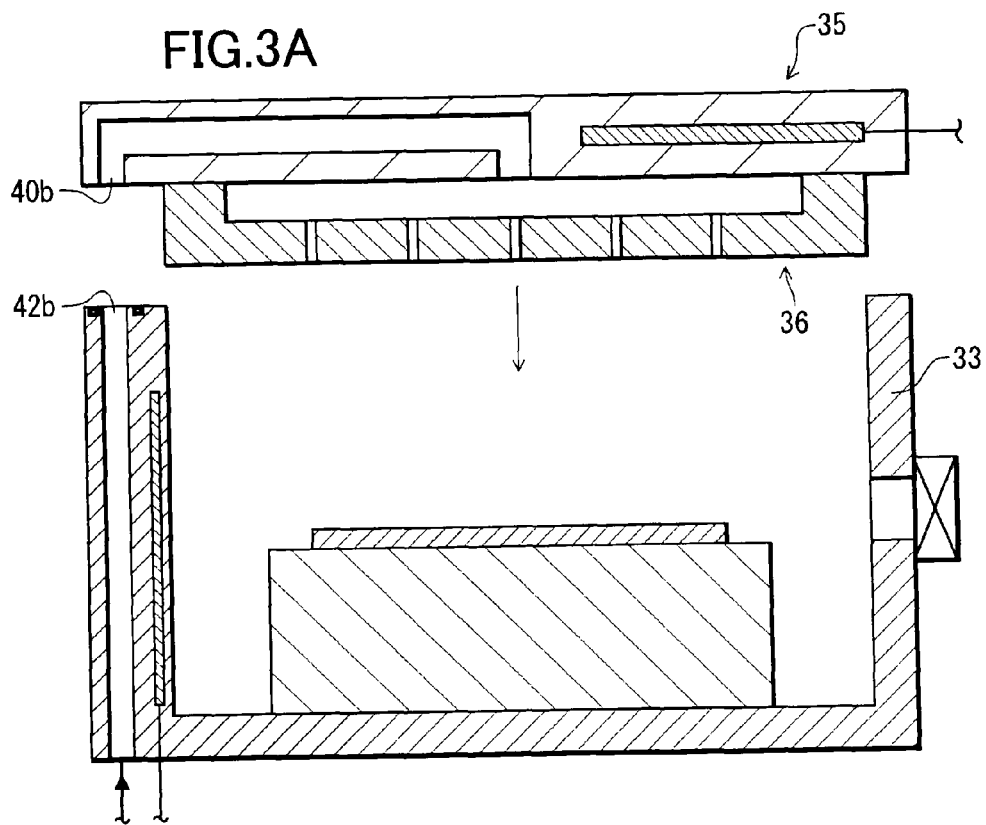
FIGS. 3A and 3B explain how an upper lid is opened and closed in a second process module.
Figure 3B:
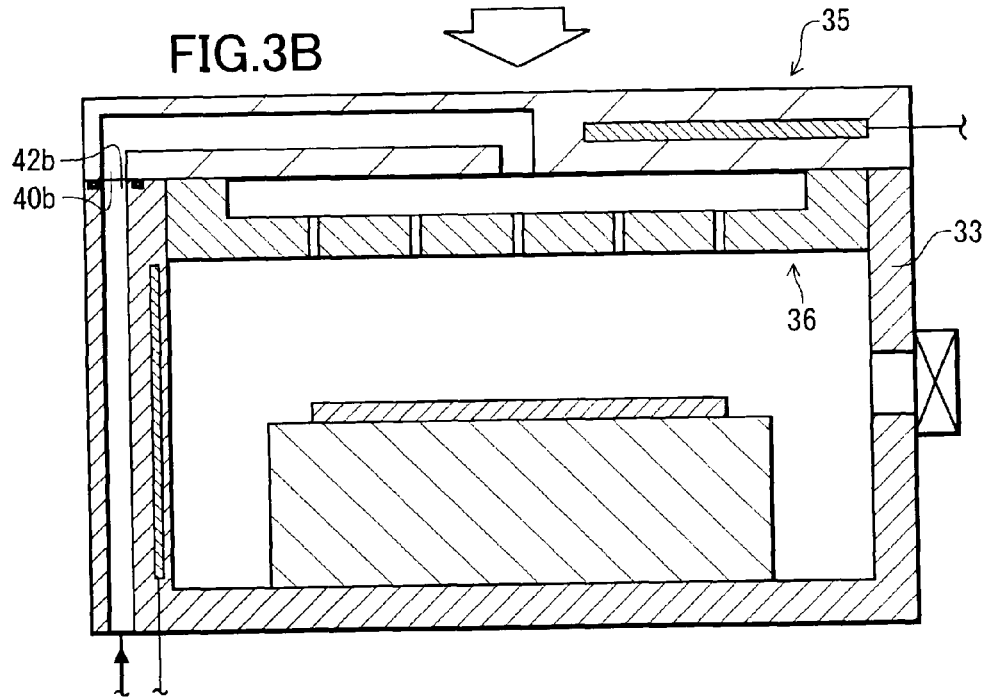

In FIG. 2, the second process module 28 has a cylindrical processing vessel 33 that accommodates the wafer W, a cooling stage 34, which serves as a mounting stage for the wafer W placed in the processing vessel 33, an upper lid 35 that engages the upper portion of the processing vessel 33 to define a processing chamber (hereinafter referred to merely as "chamber") for the wafer W as shown in FIG. 3B, and a second process module exhaust system (not shown) that discharges gases and the like in the chamber. The upper lid 35 can be detached from the processing vessel 33 as shown in FIG. 3A.

The cooling stage 34 has a coolant chamber (not shown) as a temperature adjustment mechanism. A coolant, such as cooling water and Galden (Registered trademark) fluid, held at a predetermined temperature is supplied and circulated in the coolant chamber, and the temperature at which the wafer W placed on the upper surface of the cooling stage 34 is processed is controlled through the temperature of the coolant in such a way that the resultant controlled temperature is appropriate for the chemical reaction processing.

The cooling stage 34 also has a plurality of pusher pins (not shown), which serve as lift pins that can jut out from the upper surface of the cooling stage 34. The pusher pins are retracted inside the cooling stage 34 when the wafer W is placed on the cooling stage 34, whereas jutting out from the upper surface of the cooling stage 34 to lift the wafer W upward when the wafer W is transferred out of the second process module 28 after the wafer W has undergone the chemical reaction processing.

The lower portion of the upper lid 35 is a disk-like GDP (Gas Distribution Plate) 36, which serves as a gas supplying portion that supplies hydrogen fluoride gas into the chamber (see FIG. 3A in particular). The GDP 36 has a buffer chamber 38 and a plurality of gas supply holes 39. The buffer chamber 38 communicates with the chamber through the gas supply holes 39. The GDP 36 faces the cooling stage 34 when the upper lid 35 engages the upper portion of the processing vessel 33.

A gas introduction hole 40 (first gas introduction hole) through which the hydrogen fluoride gas is introduced into the GDP 36 is formed in the upper lid 35. One end 40a of the gas introduction hole 40 is formed in such a way that it is connected to the buffer chamber 38, and the other end 40b is formed in such a way that it is connected to the other end 42b of a gas introduction hole 42, which will be described later, when the upper lid 35 engages the upper portion of the processing vessel 33. The hydrogen fluoride gas flows through the buffer chamber 38 and the gas introduction hole 40 in the upper lid 35.

The upper lid 35 has a built-in heater 41 (first temperature adjustment mechanism) as a temperature adjustment mechanism. The heater 41 heats the entire upper lid 35. Since the upper lid 35 has not only the buffer chamber 38 but also the gas introduction hole 40 therein, the heater 41 heats not only the hydrogen fluoride gas flowing through the buffer chamber 38 but also the hydrogen fluoride gas flowing through the gas introduction hole 40. Such heating prevents liquefaction of the hydrogen fluoride gas in the gas introduction hole 40.

A gas introduction hole 42 (second gas introduction hole) through which hydrogen fluoride gas is introduced from a hydrogen fluoride gas source (not shown) is formed in the processing vessel 33. One end 42a of the gas introduction hole 42 is formed in such a way that it is connected to a gas introduction tube 43 through which the hydrogen fluoride gas is introduced from the hydrogen fluoride gas source, and the other end 42b is formed in such a way that it is connected to the other end 40b of the gas introduction hole 40 when the upper lid 35 engages the upper portion of the processing vessel 33. With this configuration, the other end 40b of the gas introduction hole 40 is joined with the other end 42b of the gas introduction hole 42 when the upper lid 35 engages the upper portion of the processing vessel 33. O rings 44 are provided along the periphery close to the other end 42b of the gas introduction hole 42 to prevent leakage of the hydrogen fluoride gas.

The processing vessel 33 has a built-in heater 45 (second temperature adjustment mechanism) as a temperature adjustment mechanism. The heater 45 heats the entire processing vessel 33 to prevent deposition of impurities and the like on the inner wall surface. Since the processing vessel 33 has the gas introduction hole 42 therein, the heater 45 heats the hydrogen fluoride gas flowing through the gas introduction hole 42. Such heating prevents liquefaction of the hydrogen fluoride gas in the gas introduction hole 42.

In the second process module 28, when the chemical reaction processing is carried out on the wafer W, hydrogen fluoride gas is introduced from the hydrogen fluoride gas source through the gas introduction tube 43, the gas introduction hole 42, and the gas introduction hole 40 into the buffer chamber 38 in the GDP 36, and the hydrogen fluoride gas introduced in the buffer chamber 38 is then supplied through the GDP 36 into the chamber.

Referring again to FIG. 1, the third process module 30 has a housing-shaped processing vessel (chamber) 46, a heating stage 47, which serves as a mounting stage for the wafer W placed in the chamber 46, and a buffer arm 48 that is disposed close to the heating stage 47 and lifts the wafer W mounted on the heating stage 47 upward.

The heating stage 47 is made of aluminum and has an oxide film coated on the surface. The heating stage 47 has a built-in heater (not shown) formed of an electrically heated wire and heats the mounted wafer W to a temperature appropriate for the heating processing.

The buffer arm 48 temporarily displaces the wafer W that has undergone the chemical reaction processing above the track of a supporting portion 49 of the second transfer arm 31, allowing wafers W to be smoothly swapped in the second process module 28 and the third process module 30.

The second load-lock module 32 has a housing-shaped transfer chamber (chamber) 50 having the second built-in transfer arm 31. The internal pressure in the loader module 13 is held at atmospheric pressure, whereas the internal pressures in the second and third process modules 28 and 30 are held at vacuum, or atmospheric pressure or lower. To this end, the second load-lock module 32 has a vacuum gate valve 51 at the connecting portion between the second load-lock module 32 and the third process module 30 and an atmospheric door valve 52 at the connecting portion between the second load-lock module 32 and the loader module 13, so that the second load-lock module 32 is configured as a preliminary vacuum transfer chamber capable of adjusting the internal pressure therein.

According to the present embodiment, in the second process module 28, when the upper lid 35 engages the upper portion of the processing vessel 33, the gas introduction hole 40 formed in the upper lid 35 is joined with the gas introduction hole 42 formed in the processing vessel 33 to form an introduction path through which the hydrogen fluoride gas is introduced into the chamber. As a result, the hydrogen fluoride gas can be introduced into the chamber without connecting the introduction tube, through which the hydrogen fluoride gas is introduced into the chamber, to the upper lid 35, so that the number of parts that form the second process module 28 can be reduced. Further, since the gas introduction hole 40 is joined with the gas introduction hole 42 when the upper lid 35 engages the upper portion of the processing vessel 33, so as to form the introduction path through which the gas is introduced, the upper lid 35 can be detached from the processing vessel 33 without having to provide any part that allows the detachment of the introduction path.

Next, a description will be made of a substrate processing system including a substrate processing apparatus according to a second embodiment of the present invention.

The present embodiment is basically the same as the first embodiment described above in terms of the configuration and actions, but only differs from the first embodiment in terms of the configuration of the second process module. Accordingly, no description will be made of the similar configuration and only the configuration and actions different from those in the first embodiment will be described below.

Figure 4:
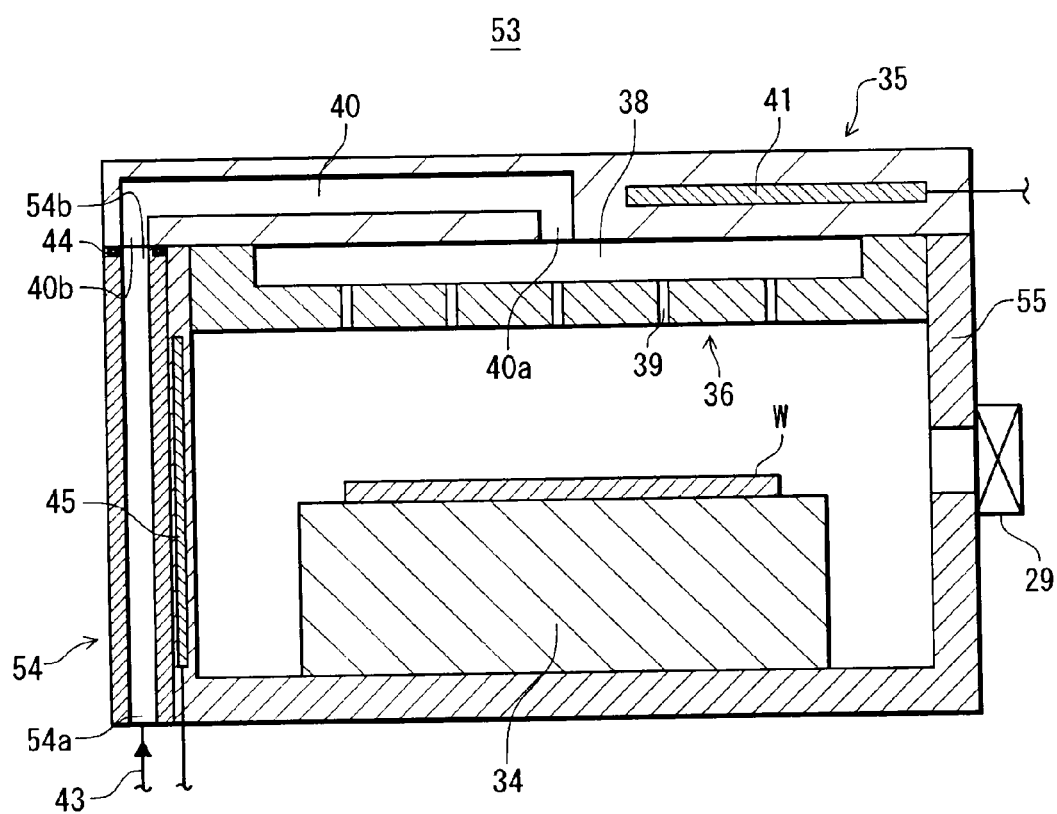
FIG. 4 is a cross-sectional view of the second process module in a second embodiment of the present invention.

FIG. 4 is a cross-sectional view of the second process module in the present embodiment.

In FIG. 4, a second process module 53 has a cylindrical processing vessel 55 to which a gas introduction tube 54 is attached. The gas introduction tube 54 introduces hydrogen fluoride gas from a hydrogen fluoride gas source (not shown). One end 54a of the gas introduction tube 54 is connected to the gas introduction tube 43 through which hydrogen fluoride gas is introduced from the hydrogen fluoride gas source, and the other end 54b is connected to the other end 40b of the gas introduction hole 40 when the upper lid 35 engages the upper portion of the processing vessel 55. The other end 40b of the gas introduction hole 40 is thus joined with the other end 54b of the gas introduction tube 54 when the upper lid 35 engages the upper portion of the processing vessel 55. O rings 44 are provided along the periphery close to the other end 54b of the gas introduction tube 54 so as to prevent leakage of the hydrogen fluoride gas.

The processing vessel 55 also has a built-in heater 45 similar to that in the first embodiment as a temperature adjustment mechanism. The heater 45 heats the entire processing vessel 55. Since the gas introduction tube 54 is attached to the processing vessel 55, the heat of the processing vessel 55 is transmitted to the gas introduction tube 54. As a result, the heater 45 ultimately heats the hydrogen fluoride gas flowing through the gas introduction tube 54. Such heating prevents liquefaction of the hydrogen fluoride gas in the gas introduction tube 54.

In the second process module 53, when the chemical reaction processing is carried out on the wafer W, the hydrogen fluoride gas is introduced from the hydrogen fluoride gas source through the gas introduction tube 43, the gas introduction tube 54, and the gas introduction hole 40 into the buffer chamber 38 in the GDP 36, and the hydrogen fluoride gas introduced in the buffer chamber 38 is then supplied through the GDP 36 into the chamber.

According to the present embodiment, in the second process module 53, when the upper lid 35 engages the upper portion of the processing vessel 55, the gas introduction hole 40 formed in the upper lid 35 is joined with the gas introduction tube 54 attached to the processing vessel 55 to form an introduction path through which the hydrogen fluoride gas is introduced into the chamber. An advantageous effect similar to that in the first embodiment described above can therefore be achieved.

According to the present embodiment, the gas introduction tube 54 through which the process gas is introduced is attached to the processing vessel 55. It is therefore possible to remove only the gas introduction tube 54 from the processing vessel 55. Accordingly, when a highly corrosive gas is introduced as the process gas, and erosion occurs inside of the gas introduction tube 54, the gas introduction tube 54 alone can be easily replaced.

The upper lid 35 described above in each of the above embodiments may be of any type, such as a hinge type and a swing arm type.

In each of the above embodiments, although the chemical reaction processing and the heating processing on a wafer W are carried out in the separate process modules, these processing operations may be carried out in a single process module.

Although in the forgoing description, the substrate processing system including the substrate processing apparatus according to each of the above embodiments has two process ships disposed parallel to each other, the configuration of the substrate processing system is not limited thereto. Specifically, the substrate processing system may have a plurality of process modules arranged in tandem or in clusters.

The substrate that undergoes the chemical reaction processing and the heating processing is not limited to a wafer for semiconductor devices, but may be various kinds of substrates used for an LCD, an FPD (Flat Panel Displays) and the like, photomasks, CD substrates, printed circuit boards and the like.

What is claimed is:

1. A substrate processing apparatus comprising:
a processing vessel adapted to accommodate a substrate, the processing vessel having a sidewall; and
an upper lid adapted to engage said processing vessel so as to define a processing chamber for the substrate,
wherein said upper lid includes a gas supplying portion adapted to supply a process gas into the processing chamber,
a gas introduction hole is formed in said upper lid, one end of the gas introduction hole being connected to the gas supplying portion to introduce the process gas into the gas supplying portion,
a gas introduction tube is attached to an outer edge of the sidewall of said processing vessel, one end of the gas introduction tube being connected to a source of the process gas to introduce the process gas from the source,
when said upper lid engages said processing vessel, the other end of the gas introduction hole is joined with the other end of the gas introduction tube, and
said gas introduction tube is provided such that said gas introduction tube is removable from said processing vessel.

2. The substrate processing apparatus according to claim 1 further comprising a first temperature adjustment mechanism adapted to adjust the temperature of said upper lid and a second temperature adjustment mechanism adapted to adjust the temperature of said processing vessel.

3. The substrate processing apparatus according to claim 2, wherein said gas introduction tube is attached to a side portion of said processing vessel.

4. The substrate processing apparatus according to claim 3, wherein said second temperature adjustment mechanism is embedded in the side portion to which said gas introduction tube is attached.

5. The substrate processing apparatus according to claim 2, wherein said second temperature adjustment mechanism is comprised of a heater having an elongated body and the heater is embedded in a side portion so as to lie along said gas introduction tube.

6. The substrate processing apparatus according to claim 1, wherein said gas introduction tube is attached to a side portion of said processing vessel.

7. The substrate processing apparatus according to claim 6, wherein a temperature adjustment mechanism is embedded in the side portion to which said gas introduction tube is attached.

8. The substrate processing apparatus according to claim 1, wherein said gas introduction tube is detachably connected to an outer perimeter of said processing vessel.

9. The substrate processing apparatus according to claim 1 further comprising a first heater adapted to adjust the temperature of said upper lid and a second heater adapted to adjust the temperature of said processing vessel.

* * * * *